United States Patent
Watanabe et al.

(10) Patent No.: US 6,169,398 B1
(45) Date of Patent: Jan. 2, 2001

(54) MAGNETIC RESONANCE IMAGING APPARATUS AND IMAGING METHOD

(75) Inventors: Shigeru Watanabe, Ibaraki-ken; Tetsuhiko Takahashi, Souka, both of (JP)

(73) Assignee: Hitachi Medical Corporation (JP)

( * ) Notice: Under 35 U.S.C. 154(b), the term of this patent shall be extended for 0 days.

(21) Appl. No.: 09/115,720

(22) Filed: Jul. 15, 1998

(30) Foreign Application Priority Data

Jul. 16, 1997 (JP) ................................................ 9-190887

(51) Int. Cl.[7] ....................................................... G01V 3/00

(52) U.S. Cl. ............................................. 324/309; 324/307

(58) Field of Search .................................... 324/309, 307

(56) References Cited

U.S. PATENT DOCUMENTS 5,779,636 * 7/1998 Kanazawa ............................ 600/41

* cited by examiner

Primary Examiner—Christine K. Oda
Assistant Examiner—Brij B. Shrivastav
(74) Attorney, Agent, or Firm—Pennie & Edmonds LLP

(57) ABSTRACT

The MRI apparatus of the present invention performs a pulse sequence for applying successively 180° pulses 102, 103 . . . after application of a 90° pulse 101 at constant intervals and applying readout magnetic fields 111 during the interval between pairs of 180° pulses while the polarity of the magnetic field 111 is inverted several times to collect a plurality of gradient echo signals that are phase encoded differently. Here, the application of the readout gradient magnetic field is controlled such that generation of the gradient echo signals does ot coincide with generation of the spin echo signal. The image reconstruction is performed by using only T2* weighted gradient echo signals to obtain images reflecting difference in magnetic susceptibility and inhomogeneities in local magnetic fields.

16 Claims, 8 Drawing Sheets

MAGNETIC RESONANCE IMAGING APPARATUS AND IMAGING METHOD

BACKGROUND OF THE INVENTION

1. Field of the Invention

The present invention relates to a magnetic resonance imaging apparatus (abbreviated as "MRI apparatus" hereinafter) and an imaging method utilizing the MRI apparatus. In particular, it relates to an MRI apparatus and an imaging method capable of producing images with high sensitivity to difference in magnetic susceptibility and inhomogeneities in local magnetic fields.

2. Related Art

Known imaging methods utilizing MRI apparatuses include various kinds of sequences for fast imaging based on the spin echo imaging method or the gradient echo imaging method. Among such imaging methods, the fast spin echo method (FSE method) is an imaging method utilizing the multiple-echo method in which multiple echoes are generated by repeatedly applying 180° pulses to inverse magnetization generated by excitation with 90° pulses. The FSE method encompasses a method where each echo signal is differently phase-encoded to obtain one image fast, and a method in which differently phase-encoded echo signals are divided into several sequence arrays to produce an image having a quality substantially the same as that obtainable in the ordinary spin echo method.

The echo planar imaging method (EPI method) is a method for acquiring a plurality of echoes with one excitation pulse by rapidly inverting read-out gradient magnetic fields without utilizing inversion by radio frequency (RF) pulses. This method enables very fast imaging, and is extremely sensitive to inhomogeneities of static magnetic fields.

Further, there are also known a hybrid sequence, which utilizes both inversion by RF pulses and inversion of gradient magnetic fields (Japanese Patent Publication No. Hei 6-46985).

In the hybrid sequence, as shown in FIG. 8, a 90° pulse RF is applied concurrently with gradient magnetic fields for slice selection Gs, and then several 180° RF pulses are applied at constant intervals (echo time interval ETI). Between these 180° pulses, several read-out gradient fields Gf are applied while the magnetic field polarity is inverted alternately. This generates several gradient echo signals GE1–GE4. When the same period of time as the interval between the 90° pulse and the first 180° pulse (ETI/2) passes after the application of the 180° pulse, a spin echo signal SE is generated. That is, the spin echo signal SE is generated at the center of the several generated gradient echo signals. For example, after the first 180° pulse, the echo signals are generated in such an order as GE1, GE2, SE, GE3 and GE4.

In the method for scanning k-space, as shown in the same figure, the phase encoding is controlled so that the spin echo signals SE fall in the low frequency region of the k-space (near the center of the k-space), and so that the T2* weighted gradient echo signals GE1–GE4 before and after SE, which reflect inhomogeneities in local magnetic fields or difference in magnetic susceptibility, fall in the radio frequency region. This enables fast image acquisition with a contrast similar to that of conventional spin echo images.

While the FSE method and the hybrid sequence can thus provide images that enjoy the advantages of spin echo images, their sensitivity to difference in magnetic susceptibility and inhomogeneities of local magnetic fields is low. They are, therefore, difficult to utilize in the BOLD method, a promising technology for examining diseases producing difference of magnetic susceptibility, such as hematoma, and measurement of brain functions.

On the other hand, the EPI method exhibits high sensitivity to difference in magnetic susceptibility and inhomogeneities of local magnetic fields, and realizes extremely short measurement time. It is, therefore, an effective imaging method for the examination of the aforesaid diseases and brain function measurement. However, it requires a strong power source capable of enabling acquisition of the signals before they are attenuated by transverse relaxation due to T2*. This make the apparatuses for the method too expensive for use as a standard apparatus for commercial use.

The object of the present invention is to provide an MRI apparatus capable of fast imaging which exhibits high sensitivity to difference in magnetic susceptibility and inhomogeneities in local magnetic fields as a standard commercial apparatus, and to provide a novel imaging method.

SUMMARY OF THE INVENTION

The MRI apparatus of the present invention essentially consists of means for generating a static magnetic field in a space where an object to be examined is placed, means for generating gradient magnetic fields in the space, a transmission system for emitting radio frequency (RF) pulses to cause nuclear magnetic resonance in nuclear spins of atoms constituting living body tissues of the object, a receiving system for detecting echo signals elicited through the nuclear magnetic resonance, a signal processing system for performing image reconstruction operation using the echo signals detected by the receiving system, control means for controlling the means for generating the gradient magnetic fields, the transmission system, the receiving system and the signal processing system in accordance with a given pulse sequence, and means for displaying the resulting image, wherein the control means executes, as the pulse sequence, a hybrid pulse sequence for applying RF pulses for exciting the nuclear spins, then applying a RF pulse for inverting the nuclear spins several times at constant intervals, and acquiring a plurality of gradient echo signals that are phase-encoded in different magnitudes between adjacent inverting RF pulses. In this sequence, the intervals of the RF pulses and the timing of the acquisition of the gradient echo signals are controlled to minimize the influence of spin echoes observed between the inverted pulses.

The RF pulse for excitation is typically, but not limited to, a RF pulse having a flip angle of 90° (90° pulse).

In the MRI apparatus of the present invention, the influence of spin echoes is minimized and the reconstruction is performed by using the T2* weighted gradient echo signals, and, therefore, the MRI apparatus can provide images reflecting difference in magnetic susceptibility and inhomogeneities in local magnetic fields.

In accordance with one embodiment of the apparatus of the present invention, the control means controls the timing of the generation of the gradient echo signals so as not to coincide with the timing of the generation of the spin echoes, and images are reconstructed by using only the gradient echo signals without generating spin echoes. Such timing of the generation of the gradient echo signals can be realized by controlling the timing of the gradient magnetic field application in the read-out direction.

In another embodiment of the MRI apparatus of the present invention, the control means executes the hybrid sequence so that the interval (interpulse time) of the inverting RF pulses is longer than twice of the interval between the RF pulse for excitation and the first inverting RF pulse and that the spin echo signals are generated at time points to phase-encode them in a high frequency region and to phase-encode the other gradient echo signals in a lower frequency region.

In this embodiment, since the generated spin echo signals are distributed (arranged) in a high frequency region of the k-space, and the gradient echo signals not containing spin-echo are distributed in a lower frequency region of the k-space, the T2* weighted gradient echo signals become predominant in determining the contrast, as in the first embodiment, and images reflecting difference in magnetic susceptibility and inhomogeneities in local magnetic fields can be provided.

Also in this case, the RF pulse for excitation is typically, but not limited to, a RF pulse having a flip angle of 90° (90° pulse).

The imaging method of the present invention is an imaging method comprising the steps of applying a RF pulse for exciting nuclear spins of an object, then applying RF pulses for inverting the nuclear spins several times at constant intervals, applying read-out gradient magnetic fields between adjacent RF pulses for inversion while the polarity of the read-out gradient magnetic fields is inverted alternately to generate a plurality of gradient echo signals, applying phase-encoding gradient magnetic fields for phase encoding the gradient echo signals, and reconstructing a magnetic resonance image based on the gradient echo signals, wherein the intervals of the RF pulses and the timing of the acquisition of the gradient echo signals are controlled to minimize influence of spin echoes generated between the inverting pulses.

In the first embodiment of the method of the present invention, the read-out gradient magnetic fields are applied in such a controlled manner that the gradient echo signals are generated at a time other than the time of the generation of the spin echo signals. The read-out gradient magnetic fields can be applied between any adjacent inversion RF pulses an even number of times, and it enables homogenous generation of gradient echo signals.

According to the second embodiment of the imaging method of the present invention, on the basis of the aforementioned hybrid sequence, the interpulse time of adjacent 180° pulses is longer than twice of the interval between the RF pulse for excitation and the first 180° pulse.

In this embodiment of the imaging method of the present invention, the timing of the spin echo to be obtained after applying the 180° pulse with respect to the timing of the gradient echo signals to be generated between the 180° pulses can be arbitrarily controlled by altering the interval between the RF (90°) pulse for excitation and the first 180° pulse. Together with appropriate phase-encoding of these echo signals, that makes it possible to reconstruct images reflecting difference in the nature of the spin echo signals and the gradient echo signals. In particular, by assigning a higher phase encode value to the spin echo signals than the other gradient echo signals, it becomes possible to obtain images reflecting difference in magnetic susceptibility and inhomogeneities in local magnetic fields.

In a further embodiment, in order to obtain images reflecting difference in magnetic susceptibility and inhomogeneities in local magnetic fields, the gradient echo signals acquired after an inverting pulse of an odd number are distributed in the k-space in one direction along the ky-axis of the k-space, and the gradient echo signals acquired after an inverting pulse of an even number are distributed in the k-space in an opposite direction along the ky-axis.

EMBODIMENT OF THE PRESENT INVENTION

Preferred embodiments of the present invention will be explained in more detail hereinafter.

Figure 7:
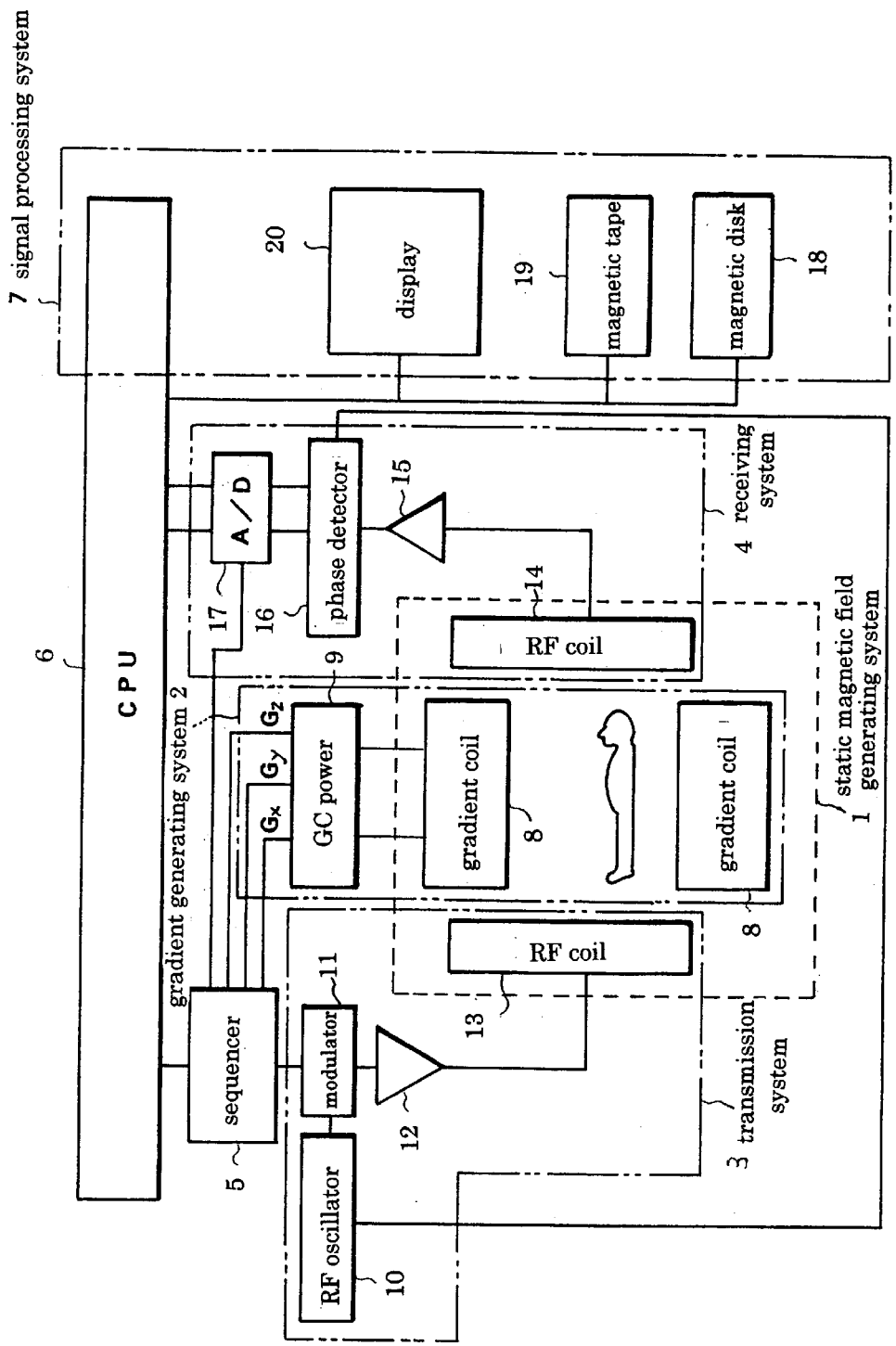
FIG. 7 is an overall block diagram of the system of the MRI apparatus of the present invention.

FIG. 7 is an overall block diagram of the system of the MRI apparatus according to the present invention. This MRI apparatus is provided with a magnet 1 which generates a static magnetic field in a space where an object to be examined is placed, a gradient magnetic field generating system 2 which applies gradient magnetic fields Gx, Gy, Gz whose intensities are varied independently and linearly in the x, y and z directions, a transmission system 3 which generates a high frequency (RF) magnetic field to cause NMR in the tissue of the object placed in the static magnetic field, a receiving system 4 which receives NMR signals emitted from the object by radiating the RF magnetic field, a sequencer 5 which controls the timing of operation of these systems, a CPU (Central Processing Unit) 6 which performs various kinds of operations for image reconstruction based on the data transmitted from the receiving system 4 and controls the overall system, and a signal processing system 7 for inputting conditions of imaging and the like to the CPU 6 and for outputting data processed by the CPU 6 in various manners.

The gradient magnetic field generating system 2 is provided with gradient magnetic field coils 8 which generate gradient magnetic fields and a power supply 9 which supplies a current to the coils 8.

The transmission system 3 comprises an RF generator 10 which generates RF signals, a modulator 11 which modulates the RF signals, a RF amplifier 12 which amplifies the modulated signals and an irradiation coil 13 which generates the RF magnetic field according to the amplified signals.

The receiving system 4 is provided with a receiving coil 14 for receiving the magnetic resonance signals, a power amplifier 15 connected to the receiving coil 14, a quadrature phase detector 16 for transforming the amplified signals to two series signals and an A/D converter 17 for converting these signals to digital data.

The signal processing system 7 is provided with exterior recording media such as a magnetic disk 18, a magnetic tape 19 and the like for recording the data processed by the CPU 6 and a display 20 such as a CRT for displaying the reconstructed images.

The sequencer 5 controls timing of operation of the three-system power supply 9 according to instructions from the CPU 6 to superimpose the gradient magnetic fields on the static magnetic field generated by the magnet 1. In the transmission system 3, signals output from the RF generator 10 are modulated by the modulator 11 under control of the sequencer 5 and then amplified by the amplifier 12. The irradiation coil 13, operated by this signal, generates an RF magnetic field of a predetermined pulse shape for application to the object.

This function of the sequencer 5 under control of the CPU 6 enables application of an RF magnetic field and gradient magnetic fields according to a predetermined pulse sequence which corresponds to a specific imaging method. As the imaging method, a hybrid sequence is performed to obtain T2* weighted images in the MRI apparatus of the present invention.

The NMR signals emitted from the object upon application of these magnetic fields are detected by the receiving coil 14 of the receiving system 4, amplified by the amplifier 15 and then divided to two series signals. These two series signals are converted into digital data by the A/D converter 17. Timing of data collection in the A/D converter 17 is controlled by the sequencer 5. The measured data are input to the CPU 6 and there subjected to operations such as a two-dimensional transform and the like to be reconstructed to an image. The reconstructed image is displayed on the display 20 and stored as image data in an exterior recording medium, i.e., the magnetic disk 18 and/or the magnetic tape 19.

An imaging method performed by the MRI apparatus of the present invention will be explained hereinafter.

Figure 1:
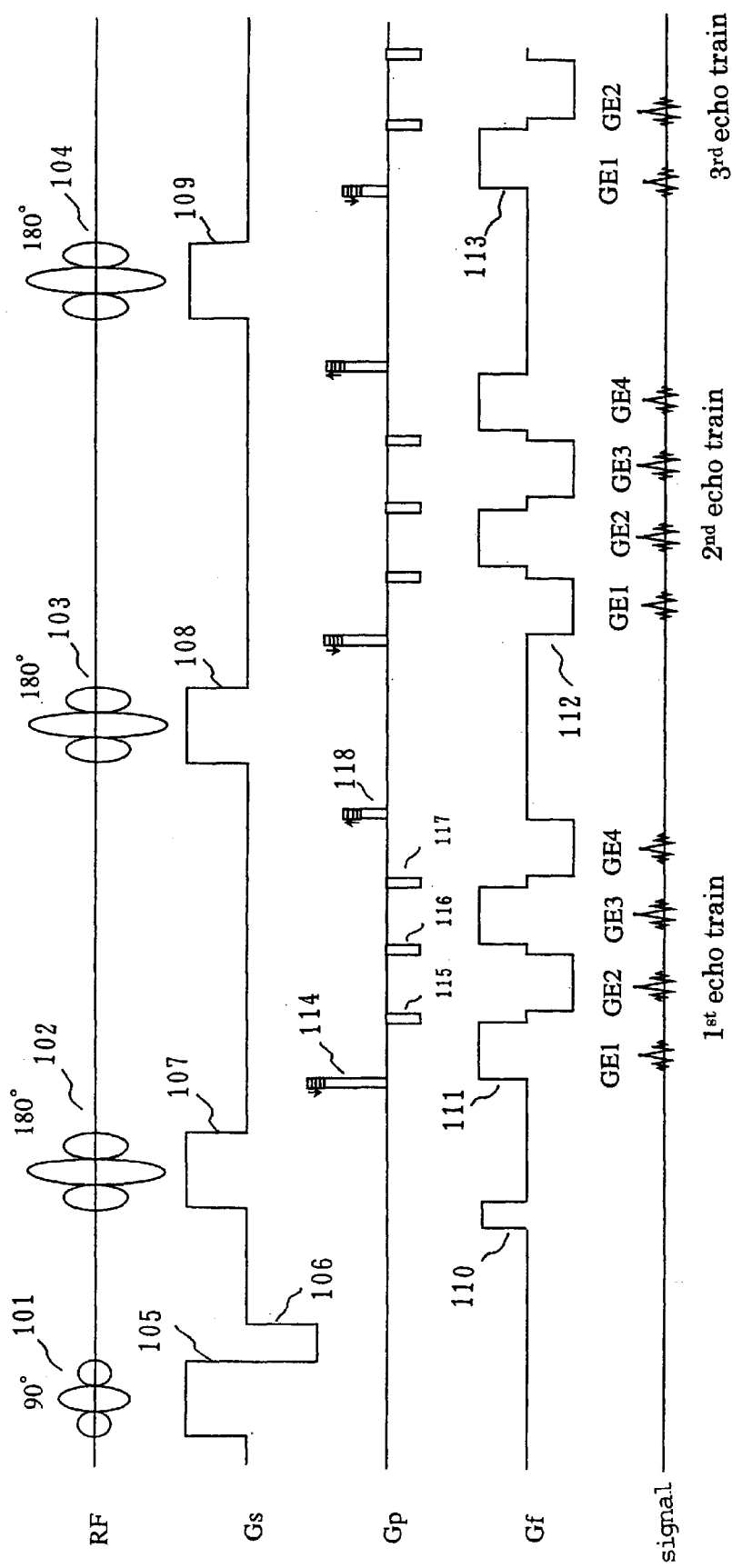
FIG. 1 is a timing chart of an example of a pulse sequence performed by the MRI apparatus of the present invention.
Figure 8:
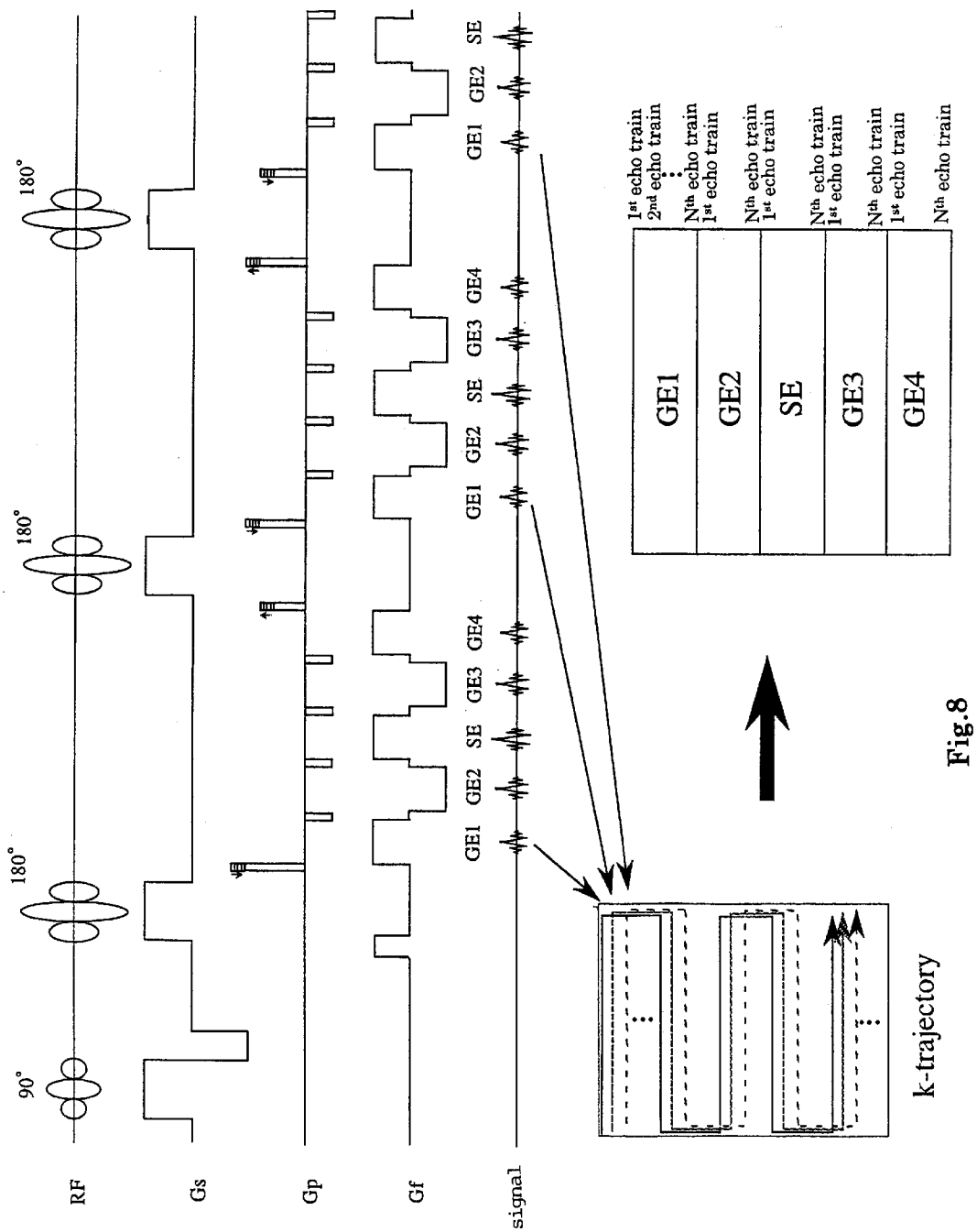
FIG. 8 is a timing chart of a conventional hybrid pulse sequence.

FIG. 1 is a timing chart showing an example of an imaging sequence according to the present invention. This sequence is based on the hybrid sequence shown in FIG. 8 and is characterized in that it does not produce spin echo signals SE.

At first, a 90° pulse 101 is applied and then a plurality of 180° pulses 102, 103, 103 . . . are applied with a constant interpulse time. If the interval between the 90° pulse 101 and the first 180° pulse 102 is ETI/2, the interpulse time between adjacent 180° pulses is ETI.

Slice selecting gradient magnetic fields Gs 105, 107, 108, . . . of positive polarity are applied together with these RF pulses to select a section to be measured. A gradient magnetic field 106 of negative polarity is applied after the application of the 90° pulse 101 to rephase the spins.

Readout gradient magnetic fields Gf 111 are applied several times in the interval between the first 180° pulse and the next 180° pulse while the polarity of the gradient magnetic field is inverted several times. A gradient echo signal is generated every time the integral value of the applied magnetic field reaches zero. This results in generation gradient echo signals GE1–GE4 of the same number as the number of inversions of the readout magnetic field.

In the conventional 90°–180° pulse series, a spin echo signal is generated upon passage of time ETI/2 after application of the 180° pulse. In this sequence, however, the inverted readout gradient magnetic fields are applied so that the echo signal is not generated at the usual time. As shown in FIG. 1, in case that the inverted readout gradient magnetic fields are applied homogeneously (uniformly) within the interval between 180° pulses, the spin echo ordinarily generated in the middle of the interval is prevented from being generated by inverting the gradient magnetic fields an even number of times (for example 4, 6 or 8 times). That is, the gradient echo signals GE1–GE4 do not include the spin echo.

These gradient echo signals GE1–GE4 are phase encoded by applying phase encoding magnetic fields Gp 114–117. The phase encoding order is, for example, such that a positive phase encoding gradient 114 with the largest phase encode value is assigned to the gradient echo GE1 and negative phase encoding gradients 115, 116, 117 are successively applied so that the phase encode values assigned to the remaining signals are reduced stepwise. Finally, a positive gradient magnetic field 118 is applied to cancel the series of the gradient magnetic fields.

The above-mentioned step of applying the inverted gradient magnetic fields Gf and the phase encoding magnetic fields Gp is repeated every time the 180° pulse is applied, and eventually, projection data in a number equal to [number of inversions of the readout gradient (number of echoes within one echo train]×[number of 180° pulses] can be collected. For example, the sequence can be effected so that inversion of the RF magnetic field by applying the 180° pulse is repeated 4–50 times every excitation by the 90° pulse and inversion of the readout gradient magnetic field during the interval between 180° pulses is repeated 4–8 (even) times to collect data of 16–200 projections. Since the number of projections necessary for reconstruction of one image is generally 126–256, the necessary data can be collected within one excitation (one shot). The number of echoes per one shot may be reduced to execute multi-shot imaging. By this, S/N and contrast of the image can be optimized. If the interpulse time of the 90° pulses (i.e., Repetition Time TR) is around five seconds, this measurement can be completed with 2–4 repetitions and within 20 seconds.

Figure 2:
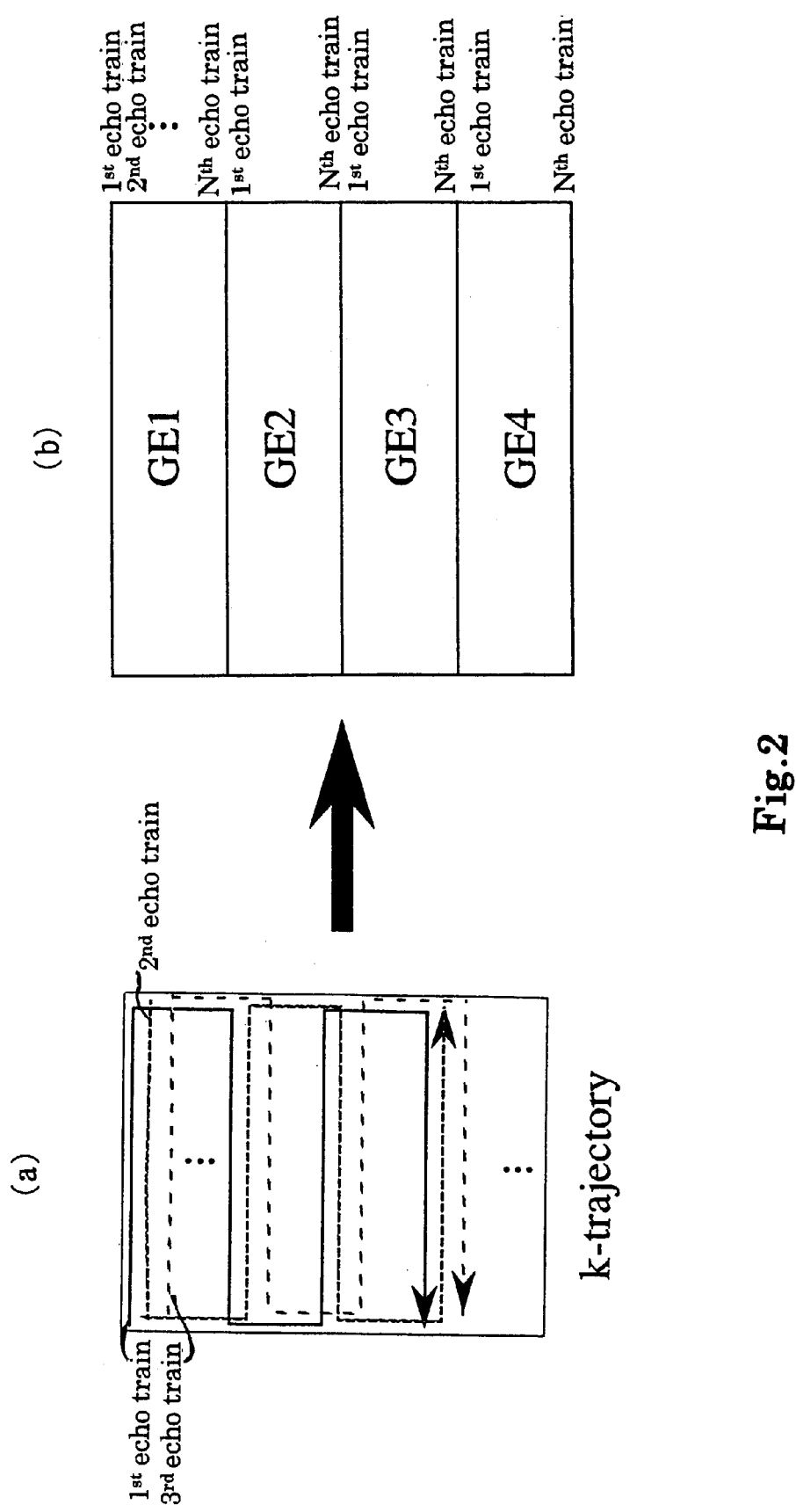
FIG. 2 shows a data distribution in a k-space obtained through the pulse sequence of FIG. 1.

The k-space scanning and distribution of the collected data are shown in FIGS. 2 (a) and (b). Data acquired after the application of the 180° pulse is sequentially distributed downward from the upper region of the k-space to eventually obtain the data distribution in the k-space shown in FIG. 2 (b).

The data obtained by executing this pulse sequence do not include any spin echo signal, which is free from the influence of inhomogeneity in the magnetic fields, and consist only of gradient echoes influenced by T2*. Therefore, by conducting a reconstruction operation using only these T2* weighted gradient echoes GE, an image reflecting the inhomogeneity in local magnetic fields or difference in magnetic susceptibility can be obtained.

Although echo signals GE1 and GE4 among the four echoes are disposed in the high frequency region of the k-space in the above-mentioned embodiment, the distribution in the k-space is not limited to this.

Among echo signals of an echo train (a series of echo signals acquired by inverting the readout magnetic field), an echo signal generated at the time nearer to the generation of a spin echo signal has a higher signal intensity and a smaller T2* weight. For example, echo signals GE1 and GE4 have a larger T2* weight than echo signals GE2 and GE3. Therefore, which echo signals are distributed to the lower frequency region or the higher frequency region of the k-space can be determined in accordance with their sensibility to inhomogeneity in local magnetic fields or difference in magnetic susceptibility and the desired image contrast.

In the above embodiment, for example, the echo signals GE1 and GE4 may be disposed in the low frequency region and the echo signals GE2 and GE3 may be disposed in the high frequency region to depict the portion which is sensitive to inhomogeneity in local magnetic fields or difference in magnetic susceptibility with high contrast.

Figure 3:
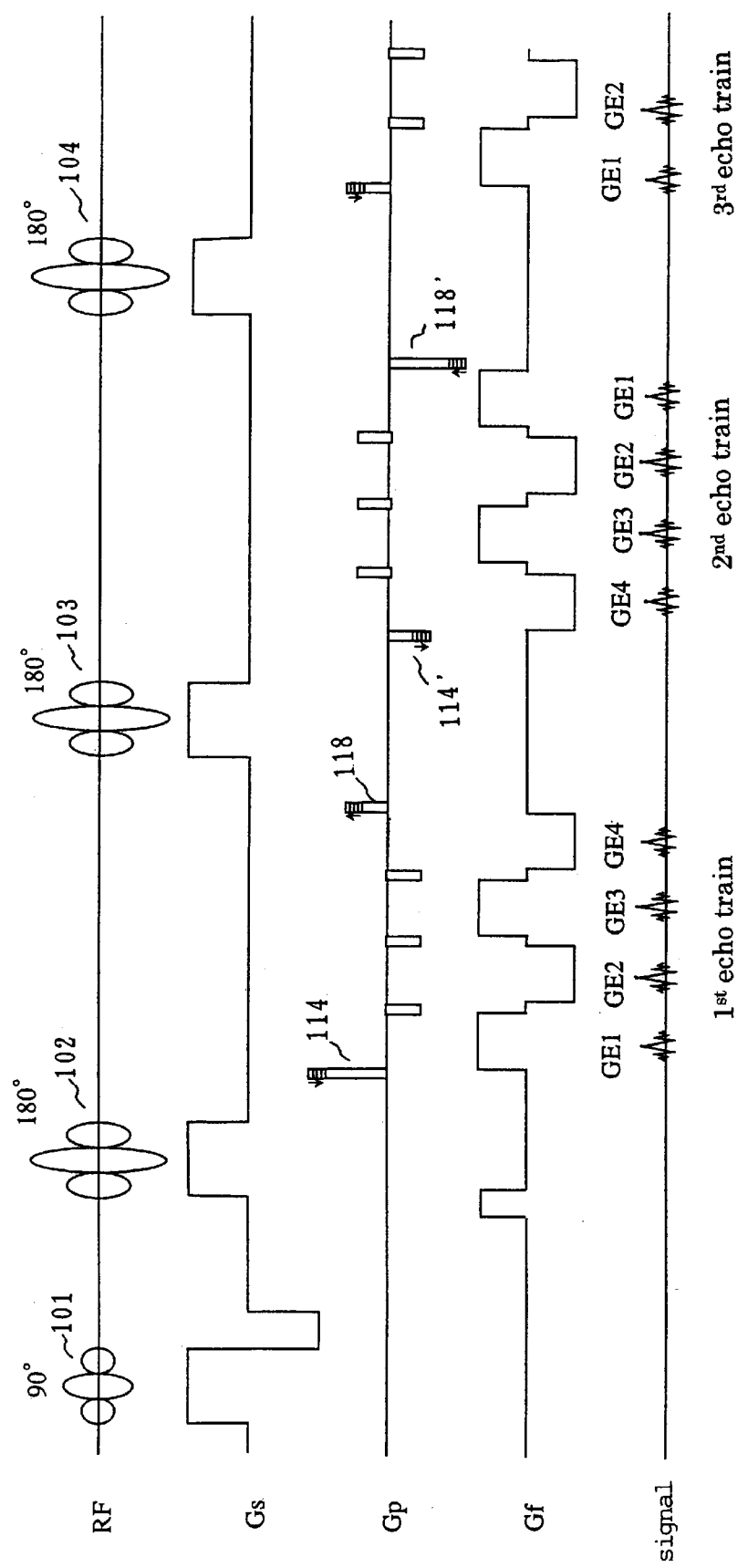
FIG. 3 is a timing chart of another example of the pulse sequence performed by the MRI apparatus of the present invention.
Figure 4:
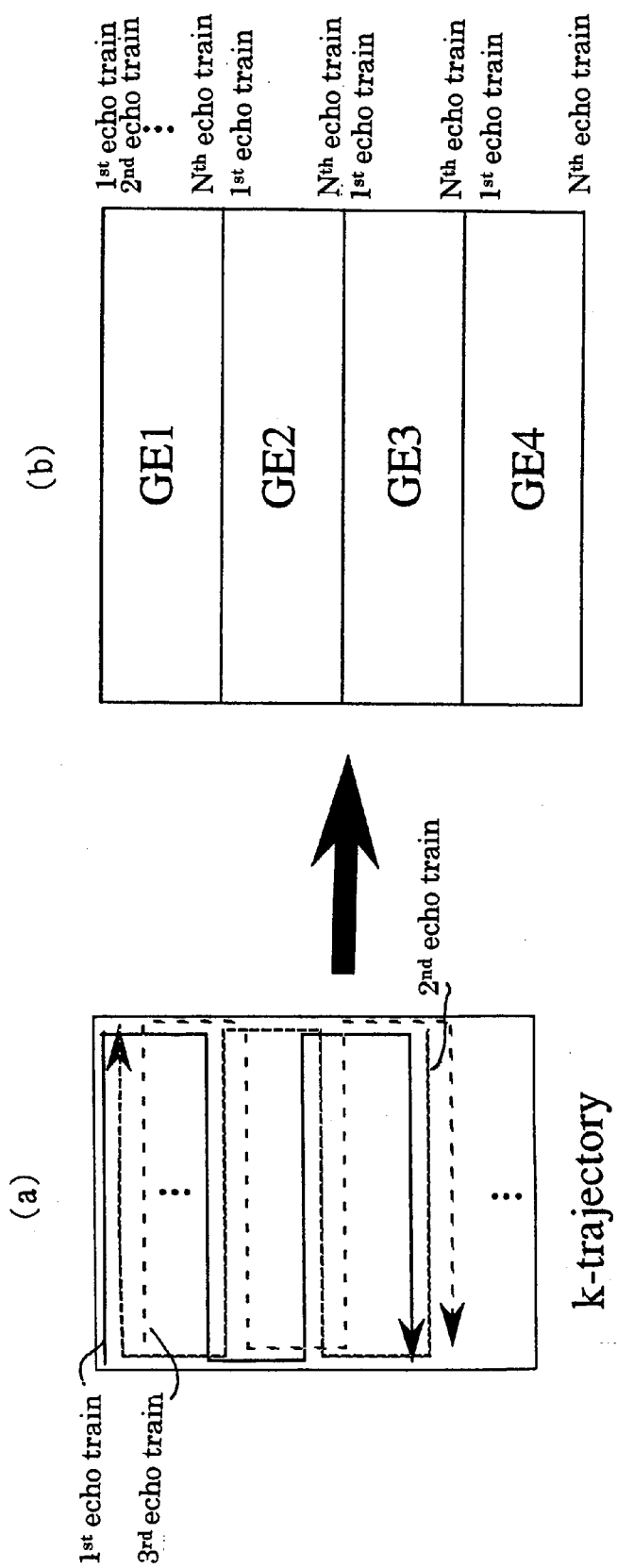
FIG. 4 shows a data distribution on a k-space obtained through the pulse sequence of FIG. 3.

The method for controlling the phase encode may be also altered. Another embodiment in which the phase encode is controlled in a different way is represented in FIG. 3. The timing of application of the 90° pulse and the 180° pulses and that of acquisition of echo signals are similar to the embodiment shown in FIG. 1. The phase encoding pattern of the phase encoding magnetic field Gp (114–118, 114'–118'), however, is different from that of FIG. 1. The scanning method or the distribution in the k-space is shown in FIGS. 4 (*a*) and (*b*). Specifically, data acquired after application of an odd-numbered 180° pulse (data of an odd-numbered echo series) are scanned downward from the top of the k-space and data acquired after application of an even-numbered 180° pulse (data of an even-numbered echo series) are scanned upward from the bottom. Eventually, data can be distributed in the k-space in a same manner as shown FIG. 2 (*b*) (FIG. 4 (*b*)).

A second embodiment of the present invention will be explained with reference to the timing chart shown in FIG. 5. This sequence is also based on the conventional hybrid sequence. Here, the timing of generation of the spin echo signal is different from the conventional sequence.

In this sequence, a 90° pulse 101 is applied at first and then a plurality of 180° pulses 102, 103 . . . are applied at constant intervals. As is in the embodiment of FIG. 1, the slice selective gradients Gs are applied together with the RF pulses. In this sequence, however, the interpulse time between two 180° pulses is different from that in the sequence shown in FIG. 1. If the interval between the 90° pulse and the first 180° pulse is $ETI_1/2$, the interpulse time between two 180° pulses is longer than $ETI_1$, i.e., $ETI_1/2 + ETI_2/2$ (here, $ETI_2 > ETI_1$). In this condition, a spin echo signal SE is generated upon passage of time $ETI_1/2$ after application of the first 180° pulse and upon passage of time $ETI_2/2$ after application of the second 180° pulse. Thus, the spin echo is generated after an odd-numbered 180° pulse with a shorter interval $ETI_1$ and is generated after an even-numbered 180° pulse with a longer interval $ETI_2$.

The inverted readout gradient magnetic fields are also applied between adjacent 180° pulses in this sequence. The timing of the application is controlled such that the spin echo is generated first after an odd-numbered 180° pulse and then gradient echoes are generated and, in a measurement conducted after an even-numbered 180° pulse, gradient echoes are generated prior to generation of the spin echo. Thus, an echo series consisting of the spin echo SE and the gradient echoes GE1, GE2, GE3, GE4 is obtained in this order after an odd-numbered 180° pulse and another echo series of the gradient echoes GE4, GE3, GE2, GE1 and the spin echo SE is obtained in this order after an even-numbered 180° pulse.

These echo signals are phase encoded by applying phase encoding gradient magnetic fields in a different manner from that of the embodiment of FIG. 1. Specifically, in an odd-numbered echo series, a positive gradient magnetic field 114 in the high frequency region, i.e., of a high phase encode value, is assigned to the spin echo SE and negative gradient magnetic fields 115, 116, 117 and 118 are applied successively. In an even-numbered echo series, inversely, a negative gradient magnetic field 114' is applied to the gradient echo signal GE4, positive gradients 115'–118' are applied successively, and a positive gradient magnetic field in the high frequency region is applied to the spin echo SE generated last.

This sequence is repeated to obtain data of the same number as the number of necessary projections. The number of necessary projections per one shot may be the number of projections required for reconstruction of a single image in order to reduce the measurement time. The projections required for a single image may be divided for multiple shot imaging in order to optimize S/N or image contrast.

Figure 6:
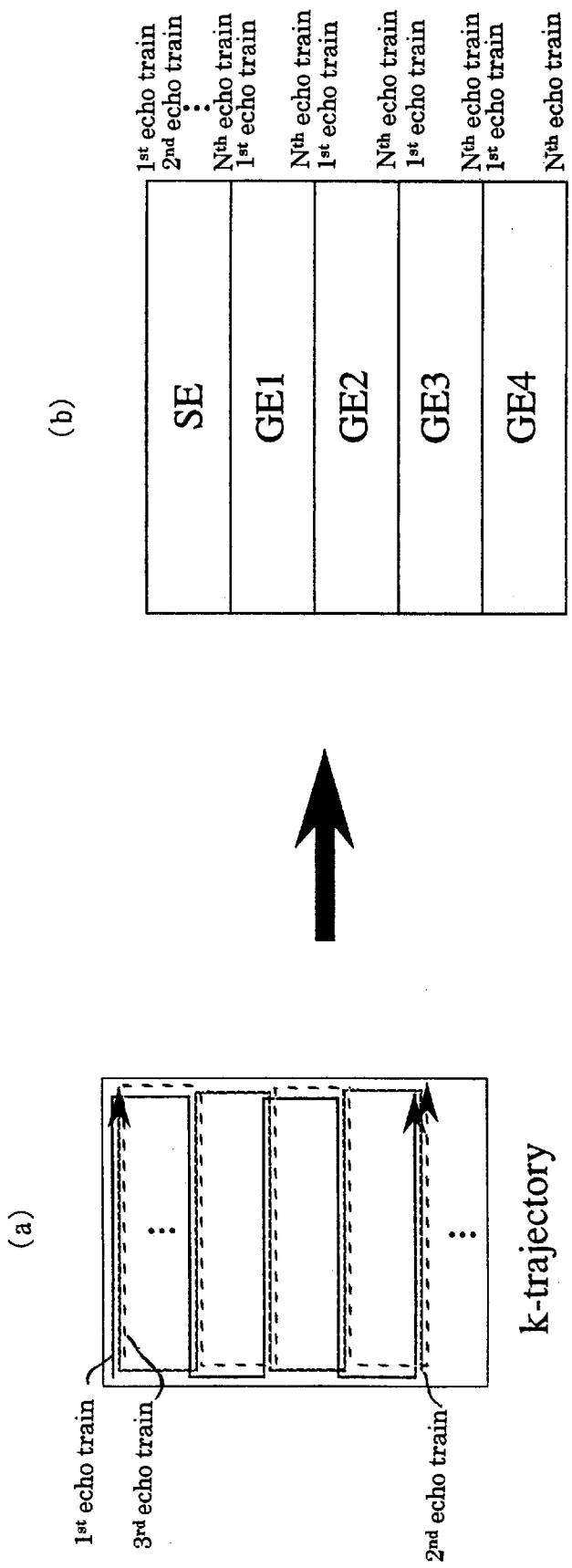
FIG. 6 shows a data distribution in a k-space obtained through the pulse sequence of FIG. 5.

The k-space scanning and distribution of the collected data are shown in FIGS. 6 (*a*) and (*b*). Data acquired after application of an odd-numbered 180° pulse (data of an odd-numbered echo series) are scanned downward from the top of the k-space and data acquired after application of an even-numbered 180° pulse are scanned upward from the bottom. Eventually, a data distribution in which the spin echo signal SE is disposed in the high frequency region of the k-space can be obtained as shown in FIG. 4 (*b*).

By distributing the gradient echo GE2, which is T2*weighted to a medium degree, to the low frequency region of the k-space and distributing the spin echo SE, which does not reflect inhomogeneity in local magnetic field or difference in magnetic susceptibility, to the high frequency region of the k-space, it is possible, in contrast to the conventional hybrid sequence (FIG. 8), to obtain an image which reflects the inhomogeneity in local magnetic fields or difference in magnetic susceptibility similarly to the sequences of FIG. 1 and FIG. 3 because the gradient echo GE2 is predominant in determining the image contrast.

Figure 5:
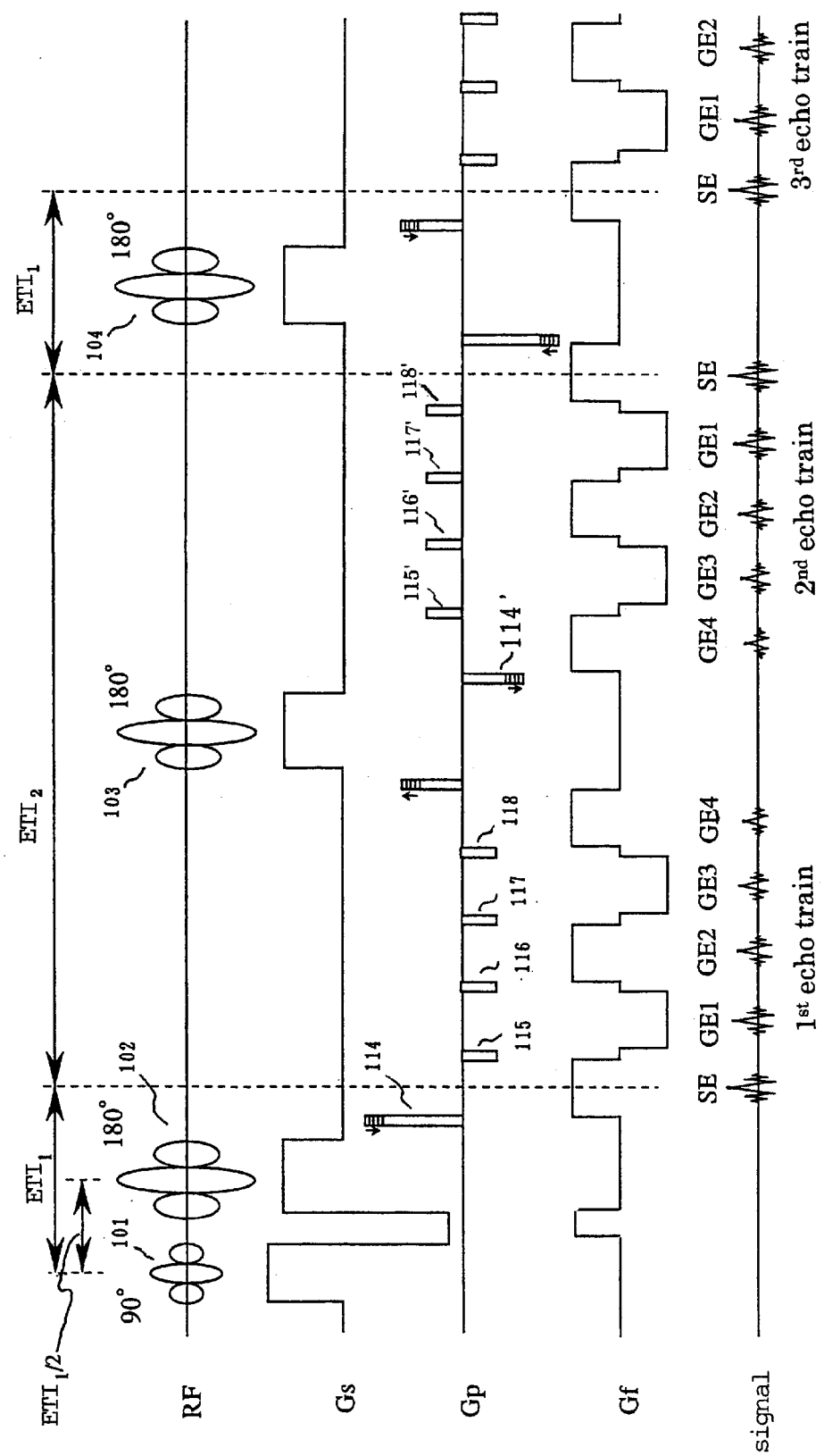
FIG. 5 is a timing chart of another example of the pulse sequence performed by the MRI apparatus of the present invention.

Although the pulse sequence shown in FIG. 5 is suitable for obtaining a T2* weighted image as explained above, it may applied to another imaging method utilizing difference between a property of the spin echo and that of the gradient echo by properly phase-encoding these echoes, since the timing of generation of the spin echo after the 180° pulse can be controlled arbitrarily in regard to timing of generation of the gradient echo by appropriately selecting two kinds of echo times ($ETI_1$, $ETI_2$).

Although two dimensional imaging has been exemplified in the above embodiments, three dimensional imaging in which phase encoding magnetic fields are applied in the slice direction can be also employed.

In accordance with the present invention, on the basis of the hybrid sequence consisting of the fast spin echo imaging and the gradient echo imaging, an image reflecting the inhomogeneity in local magnetic fields can be obtained by reconstructing the image using only the T2* weighted gradient echoes without generation of a spin echo signal.

In accordance with the present invention, an image reflecting the inhomogeneity in local magnetic fields can be obtained on the basis of the hybrid sequence by reconstructing the image using the T2* weighted gradient echoes as low frequency data, which is predominant in determining the image contrast, while the spin echo signal is acquired at the time when high frequency phase encode is applied.

In accordance with the present invention, an image which reflects the inhomogeneity in local magnetic fields can be obtained in a short period of time without employing an expensive apparatus designed for EPI or the like.

What is claimed is:

1. A magnetic resonance imaging (MRI) apparatus comprising:

means for generating a static magnetic field in a space where an object to be examined is placed, means for generating gradient magnetic fields in the space, a transmission system for emitting a radio frequency magnetic field to cause nuclear magnetic resonance (NMR) in nuclear spins of atoms constituting living body tissue of the object, a receiving system for detecting echo signals elicited through the NMR, a signal processing system for performing an image reconstruction operation using the echo signals detected by the receiving system, control means for controlling the means for generating gradient magnetic fields, the transmission system, the receiving system and the signal processing system in accordance with a predetermined pulse sequence, and means for displaying the resulting image, wherein the control means performs a hybrid sequence including application of a radio frequency pulse for exciting the nuclear spins, successive application of a plurality of radio frequency pulses for inverting the nuclear spins at constant intervals and collection of a plurality of gradient echo signals that are phase encoded differently during the interval between pairs of inverting radio frequency pulses, and controls the intervals between the radio frequency pulses and the timing of collection of the gradient echo signals to minimize influence of spin echo signals generated between the inverting radio frequency pulses.

2. A magnetic resonance imaging (MRI) apparatus comprising:

means for generating a static magnetic field in a space where an object to be examined is placed, means for generating gradient magnetic fields in the space, a transmission system for emitting a radio frequency magnetic field to cause nuclear magnetic resonance (NMR) in nuclear spins of atoms constituting living body tissue of the object, a receiving system for detecting echo signals elicited through the NMR, a signal processing system for performing an image reconstruction operation using the echo signals detected by the receiver means, control means for controlling the means for generating gradient magnetic fields, the transmission system, the receiving system and the signal processing system in accordance with a predetermined pulse sequence, and means for displaying the resulting image, wherein the control means performs a pulse sequence including application of a 90° pulse as a radio frequency pulse, successive application of 180° pulses at constant intervals and application of a plurality of readout gradient magnetic fields, the polarity of which is altered several times to generate a plurality of gradient echo signals, and application of phase encoding gradient magnetic fields for encoding the gradient echo signals, and controls the application of the readout gradient magnetic field such that generation of the gradient echo signals does not coincide with generation of the spin echo signal.

3. A magnetic resonance imaging (MRI) apparatus comprising:

means for generating a static magnetic field in a space where an object to be examined is placed, means for generating gradient magnetic fields in the space, a transmission system for emitting a radio frequency magnetic field to cause nuclear magnetic resonance (NMR) in nuclear spins of atoms constituting living body tissue of the object, a receiving system for detecting echo signals elicited through the NMR, a signal processing system for performing an image reconstruction operation using the echo signals detected by the receiver means, control means for controlling the means for generating gradient magnetic fields, the transmission system, the receiving system and the signal processing system in accordance with a predetermined pulse sequence, and means for displaying the resulting image, wherein the control means performs a pulse sequence including application of a 90° pulse as a high frequency pulse, successive application of 180° pulses at constant intervals and application of a plurality of readout gradient magnetic fields, the polarity of which is altered several times to generate a plurality of gradient echo signals, and application of phase encoding gradient magnetic fields for encoding the gradient echo signals, and controls the length of the interval ($ETI_2$) between pairs of 180° pulses to be longer than twice of an interval $ETI_1/2$) between a 90° pulse and a 180° pulse so that a spin echo signal is generated at the time when a phase encode value in the high frequency region is applied thereto.

4. An imaging method for obtaining a magnetic resonance image by applying a radio frequency pulse for exciting nuclear spins of atoms constituting an object to be examined, then applying a plurality of high frequency pulses for inverting the nuclear spins at constant intervals, applying readout gradient magnetic fields while the polarity of the readout gradient magnetic fields is altered several times during the adjacent inverting radio frequency pulses to generate a plurality of gradient echo signals, applying a phase encoding gradient magnetic field for encoding the gradient echo signals, and reconstructing a magnetic resonance image based on the gradient echo signals, wherein the intervals of the radio frequency pulses and the timing of acquisition of the gradient echo signals are controlled to minimize influence of spin echo signals generated between the inverting pulses.

5. The imaging method of claim 4, wherein the radio frequency pulse for exciting the nuclear spins is a 90° pulse.

6. The imaging method of claim 4, wherein the application of the readout gradient magnetic fields is controlled so that the generation of the spin echo does not coincide with the generation of the gradient echoes.

7. The imaging method of claim 6, wherein the readout gradient magnetic field is applied an even number of times between adjacent inverting radio frequency pulses.

8. The imaging method of claim 4, wherein the interval between the adjacent radio frequency pulses is longer than twice the interval between the exciting radio frequency pulse and the first inverting radio frequency pulse.

9. The imaging method of claim 8, wherein the radio frequency pulse for exciting the nuclear spins is a 90° pulse.

10. The imaging method of claim 8, wherein the gradient echo signals acquired after an odd-numbered inverting RF pulse are distributed in a k-space in one direction along the ky-axis of the k-space, and the gradient echo signals acquired after an even-numbered inverting RF pulse are distributed in the k-space in an opposite direction along the ky-axis.

11. A magnetic resonance imaging (MRI) apparatus comprising:
means for generating a static magnetic field in a space where an object to be examined is placed,
means for generating gradient magnetic fields in the space,
a transmission system for emitting a radio frequency magnetic field to cause nuclear magnetic resonance (NMR) in nuclear spins of atoms constituting living body tissue of the object,
a receiving system for detecting echo signals elicited through the NMR,
a signal processing system for performing an image reconstruction operation using the echo signals detected by the receiving system,
control means for controlling the means for generating gradient magnetic fields, the transmission system, the receiving system and the signal processing system in accordance with a predetermined pulse sequence, and
means for displaying the resulting image,
wherein the control means performs a first sequence including application of a first radio frequency pulse for exciting the nuclear spins and a second radio frequency pulse(s) for inverting the nuclear spins to generate an echo signal(s), and a second sequence including application of the first radio frequency pulse and gradient magnetic fields whose polarities are alternately inverted while changing the phase encode amount to generate a series of echo signals phase encoded differently, and controls the interval between the first radio frequency pulse and the second radio frequency pulse so that the echo signal in the first sequence is generated before or after generation of the series of echo signals in the second sequence.

12. A magnetic resonance imaging (MRI) apparatus comprising:
means for generating a static magnetic field in a space where an object to be examined is placed,
means for generating gradient magnetic fields in the space,
a transmission system for emitting a radio frequency magnetic field to cause nuclear magnetic resonance (NMR) in nuclear spins of atoms constituting living body tissue of the object,
a receiving system for detecting echo signals elicited through the NMR,
a signal processing system for performing an image reconstruction operation using the echo signals detected by the receiving system,
control means for controlling the means for generating gradient magnetic fields, the transmission system, the receiving system and the signal processing system in accordance with a predetermined pulse sequence, and
means for displaying the resulting image,
wherein the control means performs a first sequence including application of a first radio frequency pulse for exciting the nuclear spins and a second radio frequency pulse(s) for inverting the nuclear spins to generate an echo signal(s), and a second sequence including application of the first radio frequency pulse and gradient magnetic fields whose polarities are alternately inverted while changing the phase encode amount to generate a series of echo signals phase encoded differently, and controls the timing of application of the inverted gradient magnetic fields so that generation of the echo signal in the first sequence substantially overlaps with generation of any one of the echo signals in the second sequence.

13. An imaging method for obtaining a magnetic resonance image by performing a first sequence including application of a first radio frequency pulse for exciting the nuclear spins and a second radio frequency pulse(s) for inverting the nuclear spins to generate an echo signal(s), and a second sequence including application of the first radio frequency pulse and gradient magnetic fields whose polarities are alternately inverted while changing the phase encode amount to generate a series of echo signals phase encoded differently,
wherein the interval between the first radio frequency pulse and the second radio frequency pulse is controlled so that the echo signal in the first is generated before or after generation of the series of echo signals in the second sequence.

14. A magnetic resonance imaging (MRI) apparatus comprising:
means for generating a static magnetic field in a space where an object to be examined is placed,
means for generating gradient magnetic fields in the space,
a transmission system for emitting a radio frequency magnetic field to cause nuclear magnetic resonance (NMR) in nuclear spins of atoms constituting living body tissue of the object,
a receiving system for detecting echo signals elicited through the NMR,
a signal processing system for performing an image reconstruction operation using the echo signals detected by the receiving system,
control means for controlling the means for generating gradient magnetic fields, the transmission system, the receiving system and the signal processing system in accordance with a predetermined pulse sequence, and
means for displaying the resulting image,
wherein the control means controls an interval between a first radio frequency pulse for exciting nuclear spins and a second radio frequency pulse for inverting the nuclear spins so that an echo signal caused by the inverting radio frequency pulse is generated before or after generation of a series of gradient echo signals.

15. A magnetic resonance imaging (MRI) apparatus comprising:
means for generating a static magnetic field in a space where an object to be examined is placed,
means for generating gradient magnetic fields in the space,
a transmission system for emitting a radio frequency magnetic field to cause nuclear magnetic resonance (NMR) in nuclear spins of atoms constituting living body tissue of the object,
a receiving system for detecting echo signals elicited through the NMR,
a signal processing system for performing an image reconstruction operation using the echo signals detected by the receiving system,
control means for controlling the means for generating gradient magnetic fields, the transmission system, the receiving system and the signal processing system in accordance with a predetermined pulse sequence, and means for displaying the resulting image, wherein the control means controls gradient magnetic fields to be inverted even times so that generation time of an echo signal caused by a radio frequency pulse for inverting nuclear spins is within generation time of a series of gradient echo signals to restrain the echo signal caused by the inverting radio frequency pulse.

16. A magnetic resonance imaging (MRI) apparatus comprising:

means for generating a static magnetic field in a space where an object to be examined is placed, means for generating gradient magnetic fields in the space, a transmission system for emitting a radio frequency magnetic field to cause nuclear magnetic resonance (NMR) in nuclear spins of atoms constituting living body tissue of the object, a receiving system for detecting echo signals elicited through the NMR, a signal processing system for performing an image reconstruction operation using the echo signals detected by the receiver system, control means for controlling the means for generating gradient magnetic fields, the transmission system, the receiving system and the signal processing system in accordance with a predetermined pulse sequence, and means for displaying the resulting image, wherein the control means performs a hybrid sequence including application of a radio frequency pulse for exciting the nuclear spins, successive application of a plurality of radio frequency pulses for inverting the nuclear spins at constant intervals and collection of a plurality of gradient echo signals that are phase encoded differently during the interval between pairs of inverting radio frequency pulses, and controls the intervals between the radio frequency pulses or the timing of collection of the gradient echo signals to minimize influence of spin echo signals generated between the inverting radio frequency pulses.

* * * * *